(12) United States Patent
Matsushita

(10) Patent No.: US 6,822,313 B2
(45) Date of Patent: Nov. 23, 2004

(54) DIODE

(75) Inventor: Kenichi Matsushita, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/105,390

(22) Filed: Mar. 26, 2002

(65) Prior Publication Data

US 2002/0140054 A1 Oct. 3, 2002

(30) Foreign Application Priority Data

Mar. 27, 2001 (JP) ....................................... 2001-090061

(51) Int. Cl.[7] .............................................. H01L 29/00
(52) U.S. Cl. .................................... 257/544; 257/484
(58) Field of Search ................................ 257/544, 546, 257/484, 104

(56) References Cited

U.S. PATENT DOCUMENTS

| 4,847,668 | A | * | 7/1989 | Sugawa et al. | ............. | 257/462 |
| 5,502,329 | A | * | 3/1996 | Pezzani | ...................... | 257/546 |
| 5,559,361 | A | | 9/1996 | Pezzani | ...................... | 257/546 |
| 5,631,181 | A | | 5/1997 | Pezzani | ...................... | 438/106 |
| 6,107,673 | A | | 8/2000 | Rivet | ........................ | 257/601 |
| 2002/0020893 | A1 | * | 2/2002 | Lhorte | ....................... | 257/481 |

* cited by examiner

Primary Examiner—Phat X. Cao
(74) Attorney, Agent, or Firm—Oblon, Spivak, McClelland, Maier & Neustadt, P.C.

(57) ABSTRACT

A diode has a semiconductor layer of a first conductive type having a first principal plane and a second principal plane facing the first principal plane; a first impurity layer of a second conductive type which is opposite to said first conductive type, said first impurity layer being selectively formed on said first principal plane of said semiconductor layer; a second impurity layer of the first conductive type which is selectively formed on said first principal plane of said semiconductor layer apart from said first impurity layer; a first main electrode connected to said first impurity layer; a second main electrode connected to said second impurity layer; a third impurity layer of the first conductive type which is selectively formed on said second principal plane of said semiconductor layer and which is formed so as to face said first impurity layer; a fourth impurity layer of the second conductive type which is selectively formed on said second principal plane of said semiconductor layer and which is formed so as to face said second impurity layer; and short-circuit part to electrically connect said third impurity layer to said fourth impurity layer.

7 Claims, 5 Drawing Sheets

DIODE

CROSS REFERENCE TO RELATED APPLICATION

This application is based upon and claims the benefit of priority from the prior Japanese Patent Application No. 2001-90061, filed on Mar. 27, 2001; the entire contents of which are incorporated herein by reference.

BACKGROUND OF THE INVENTION

The present invention generally relates to a diode. More specifically, the invention relates to a high-withstand-voltage, high-speed diode.

In general, a diode is used as a switching element in a rolling stock, such as an electric train. A diode of this type requires a high withstand voltage and a high speed operation.

FIG. 7 shows the structure of a cross section of a conventional high-withstand-voltage, high-speed diode, which is a part of diode structure shown in the U.S. Pat. No. 5,631,181.

Referring to FIG. 7, a p-type anode layer 102 is selectively diffused and formed in the central portion on the surface of a $n^-$-type semiconductor substrate (semiconductor layer) 101, and an n-type stopper layer 104 is selectively diffused and formed in the peripheral edge portion of the layer 101 so as to surround the p-type anode layer 102. An anode electrode 103 is formed on the surface of the p-type anode layer 102 so as to ohmic-contact the surface of the p-type anode layer 102.

On the other hand, an n-type cathode layer 105 is diffused and formed on the whole reverse surface of the layer 101, and a cathode electrode 106 is formed on the surface of the n-type cathode layer 105 so as to ohmic-contact the surface of the n-type cathode layer 105.

In such a high-withstand-voltage, high-speed diode, if a forward voltage is applied between the anode electrode 103 and the cathode electrode 106, holes are injected into the layer 101 from the p-type anode layer 102, and electrons are injected into the layer 101 from the n-type cathode layer 105, so that the layer 101 is filled with high densities of holes and electrons to be in a high injection state. If the layer 101 is thus in a high injection state, a current flows between the anode and cathode electrodes at a very low voltage. Therefore, in order to decrease the forward voltage drop (ON-state voltage) of the high-withstand-voltage diode, it is an important design item to fill the layer 101 with pairs of electrons and holes (which will be hereinafter referred to as carriers).

On the other hand, during switching of the diode, it is required to release the carriers accumulated in the layer 101. As the number of the carriers accumulated in the layer 101 increases, it takes a lot of time to release the carrier, so that switching loss increases. Therefore, in order to improve switching loss, the layer 101 is generally designed to be thinner.

However, the smallest thickness for ensuring a reverse blocking voltage is physically fixed and can not be decreased, so that there is a problem in that switching loss is large.

SUMMARY OF THE INVENTION

According an embodiment of the present invention, there is provided a diode comprising:

a semiconductor layer of a first conductive type having a first principal plane and a second principal plane facing the first principal plane;

a first impurity layer of a second conductive type which is opposite to said first conductive type, said first impurity layer being selectively formed on said first principal plane of said semiconductor layer;

a second impurity layer of the first conductive type which is selectively formed on said first principal plane of said semiconductor layer apart from said first impurity layer;

a first main electrode connected to said first impurity layer;

a second main electrode connected to said second impurity layer;

a third impurity layer of the first conductive type which is selectively formed on said second principal plane of said semiconductor layer and which is formed so as to face said first impurity layer;

a fourth impurity layer of the second conductive type which is selectively formed on said second principal plane of said semiconductor layer and which is formed so as to face said second impurity layer; and short-circuiting part to electrically connect said third impurity layer to said fourth impurity layer.

According to another embodiment of the present invention, there is provided a diode comprising:

a semiconductor layer of a first conductive type having a first principal plane and a second principal plane facing the first principal plane;

a first semiconductor layer of a second conductive type which is selectively formed on said first principal plane of said semiconductor layer;

a second impurity layer of the first conductive type which is selectively formed on said first principal plane of said semiconductor layer apart from said first impurity layer;

an electrical insulating region which is formed in said first semiconductor layer from said first principal plane of said semiconductor layer between said first and second impurity layers;

a first main electrode connected to said first impurity layer;

a second main electrode connected to said second impurity layer;

a third impurity layer of the first conductive type which is selectively formed on said second principal plane of said semiconductor layer and which is formed so as to face said first impurity layer;

a fourth impurity layer of the second conductive type which is selectively formed on said second principal plane of said semiconductor layer and which is formed so as to face said second impurity layer; and short-circuit part to electrically connect said third impurity layer to said fourth impurity layer.

According to further embodiment of the present invention, there is provided a diode comprising:

a semiconductor layer of a first conductive type having a first principal plane and a second principal plane facing the first principal plane;

a first impurity layer of a second conductive type which is selectively formed on said first principal plane of said semiconductor layer;

a second impurity layer of the first conductive type which is selectively formed on said first principal plane of said semiconductor layer apart from said first impurity layer;

a low life time region which is formed in said semiconductor layer from said first principal plane of said semiconductor layer between said first and second impurity layers;

a first main electrode connected to said first impurity layer;

a second main electrode connected to said second impurity layer;

a third high-density impurity layer of the first conductive type which is selectively formed on said second principal plane of said semiconductor layer and which is formed so as to face said first impurity layer;

a fourth impurity layer of the second conductive type which is selectively formed on said second principal plane of said semiconductor layer and which is formed so as to face said second impurity layer; and short-circuit part to electrically connect said third impurity layer to said fourth impurity layer.

DETAILED DESCRIPTION OF THE INVENTION

Referring now to the accompanying drawings, the embodiments of the present invention will be described below.

(First Embodiment)

Figure 1:
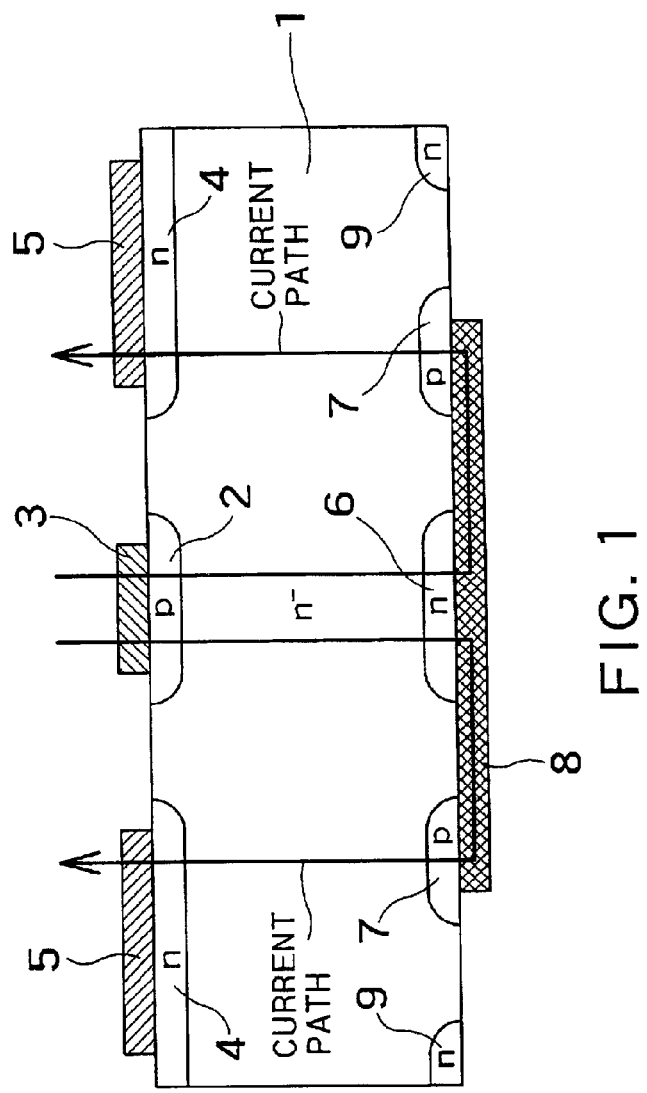
FIG. 1 is a cross sectional view schematically showing the first embodiment of a diode according to the present invention.

FIG. 1 is a sectional view showing the first embodiment of a high-withstand-voltage, high-speed diode according to the present invention. In this embodiment, a first conductive type is n type, and a second conductive type is p type. Inversely, the first conductive type may be p type, and the second conductive type may be n type.

As shown in FIG. 1, in this embodiment, a high-resistance n$^-$-type semiconductor substrate (semiconductor layer) 1 is formed so as to have a thickness of, e.g., 200 µm, and have a first principal plane and a second principal plane facing the first principal plane. A p-type anode layer 2 having, e.g., a flat circular structure, serving as a first impurity layer is selectively diffused and formed in the central portion on the first principal plane of the n$^-$-type semiconductor layer 1. An anode electrode 3 having a flat circular structure serving as a first main electrode is provided on the surface of the p-type anode layer 2 so as to ohmic-contact the surface of the p-type anode layer 2.

An n-type cathode layer 4 serving as a second impurity layer is selectively diffused and formed on the first principal plane of the n$^-$-type semiconductor layer apart from the p-type anode layer 2. For example, the n-type cathode layer 4 has a flat annular structure so as to surround the p-type anode layer 2. The n-type cathode layer 4 is sufficiently spaced from the p-type anode layer 2 by, e.g., about 1 mm, so that a parasitic diode comprising the p-type anode layer 2 and the n-type cathode layer 4 does not operate.

A cathode electrode 5 having a flat annular structure serving as a second main electrode is provided on the surface of the n-type cathode layer 4 so as to ohmic-contact the surface of the n-type cathode layer 4.

On the other hand, an n-type impurity layer 6 having, e.g., a flat circuit structure, serving as a third high-density impurity layer is selectively diffused and formed in the central portion on the second principal plane of the n$^-$-type semiconductor layer 1 so as to face the p-type anode layer 2.

Similarly, a p-type impurity layer 7 serving as a fourth high-density impurity layer is selectively diffused and formed on the second principal plane of the n$^-$-type semiconductor layer 1 so as to face the n-type cathode layer 4. The p-type impurity layer 7 is formed so as to face a portion of the n-type cathode layer 4 on the side of the p-type anode layer 2, and has, e.g., a flat annular structure, so as to surround the n-type impurity layer 6.

A metal layer 8 having, e.g., a flat circular structure, serving as an electric short-circuit part extends between the n-type impurity layer 6 and the p-type impurity layer 7 so as to ohmic-contact them, and both layers 6 and 7 are electrically connected to each other.

An n-type stopper layer 9 having, e.g., a flat annular structure, serving as a fifth impurity layer is selectively diffused and formed on the peripheral edge of the second principal plane of the n$^-$-type semiconductor layer 1 so as to surround the p-type impurity layer 7.

In the high-withstand-voltage, high-speed diode with this construction, if a forward voltage is applied between the anode electrode 3 and the cathode electrode 5, holes are injected into the n$^-$-type semiconductor layer 1 from the p-type anode layer 2, and electrons are injected into the n$^-$-type semiconductor layer 1 from the n-type cathode layer 4. Since the p-type anode layer 2 and the n-type cathode layer 4 are sufficiently spaced from each other so that the parasitic diode comprising the layers 2 and 4 does not operate as described above, electrons from the n-type impurity layer 6 and holes from the p-type impurity layer 7 are injected into the n$^-$-type semiconductor layer 1 in order to satisfy charge neutral conditions of the n$^-$-type semiconductor layer 1, so that currents flow through current paths as shown by thick solid lines and arrows in FIG. 1.

Figure 2A:
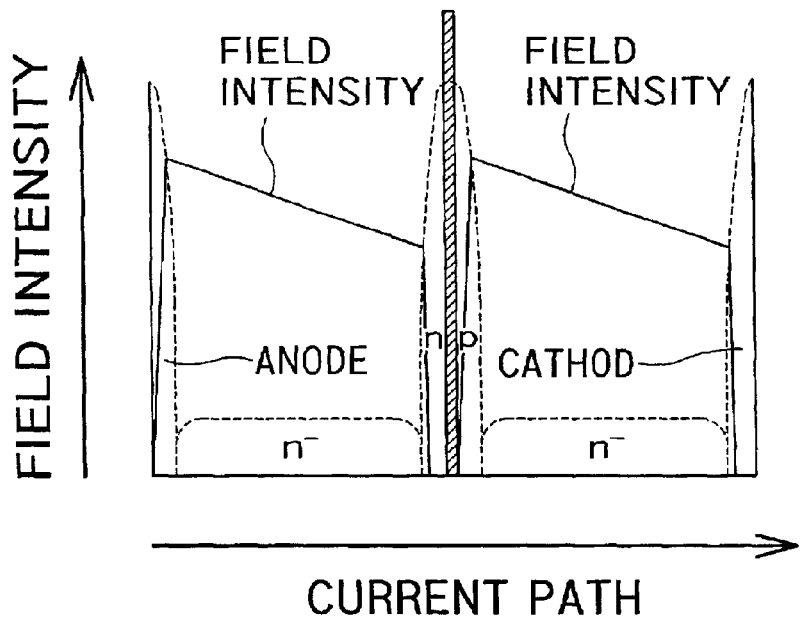
FIG. 2A and FIG. 2B are field intensity distribution maps which one-dimensionally show the state of a field intensity distribution along a current path in the first embodiment of the present invention and a conventional diode, respectively.
Figure 2B:
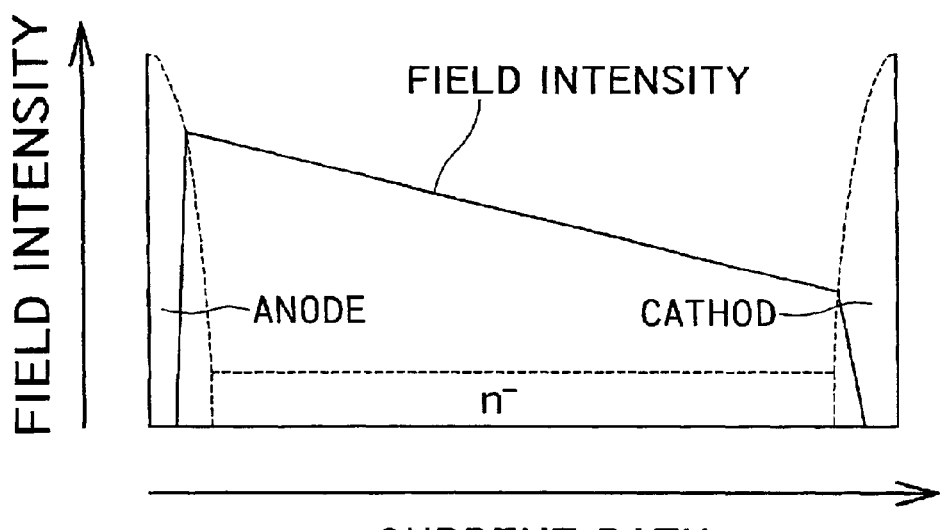

FIG. 2A is a field intensity distribution map which one-dimensionally shows a field intensity distribution along a current path in the diode in this embodiment, and FIG. 2B is a field intensity distribution map which shows the same field intensity distribution with respect to a conventional diode which is formed so as to have the same rating as that of the diode in this embodiment.

As can be clearly seen from the comparison of these maps, the distance between the anode electrode and the cathode electrode in the diode in this embodiment is shorter (the thickness of the diode in this embodiment is thinner) than that of the conventional diode although these diodes have the same rated voltage, e.g., 2500 V. Because the n-type impurity layer 6 and the p-type impurity layer 7 are formed via the metal layer 8 to raise the field intensity between the p-type impurity layer 7 and the cathode electrode 4. That is, since the applied voltage between the anode electrode and the cathode electrode is divided into a voltage at a first diode portion comprising the p-type anode layer 2 and the n-type impurity layer 6, and a voltage at a second diode portion comprising the p-type impurity layer 7 and the n-type cathode layer 5, it is possible to obtain the same withstand voltage as that of the conventional diode even if the thickness of n⁻-type semiconductor layer 11 is decreased. For example, the thickness of the layer 11 in this embodiment may be about 200 μm which is very thin and which is half or less as large as that of the conventional diode although the thickness of the layer 11 of the conventional diode must be about 500 μm.

Since the n⁻-type semiconductor layer 11 is thin, the carriers accumulated in the n⁻-type semiconductor layer 11 are discharged for a shorter time than that in the conventional diode during switching, so that switching loss is small.

Figure 3A:
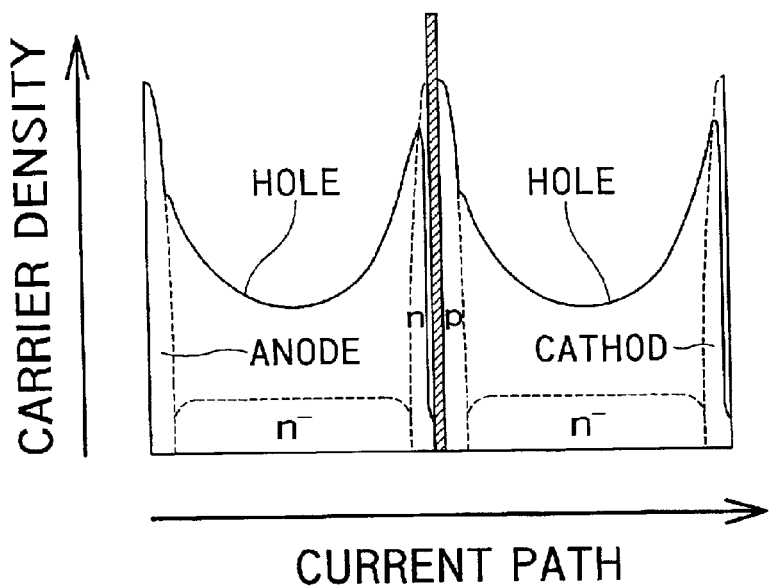
FIGS. 3A and 3B are carrier density distribution maps which one-dimensionally show a carrier density distribution along a current path in the first embodiment of the present invention and a conventional diode, respectively.
Figure 3B:
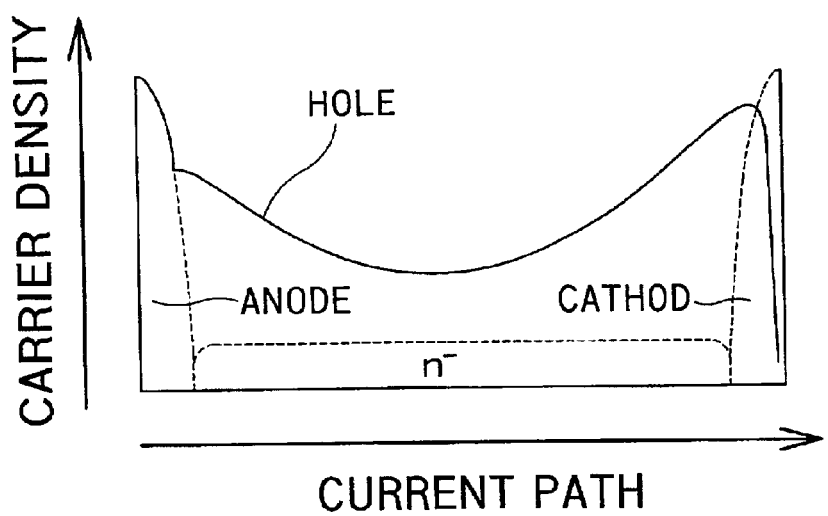

FIG. 3A is a carrier density distribution map which one-dimensionally shows the state of a carrier density distribution along a current path the diode in the first embodiment, and FIG. 3B is a carrier density distribution map similarly showing a carrier density distribution with respect to a conventional diode which is formed so as to have the same rating as that of the diode in this embodiment.

As can be clearly seen from the comparison of these maps, the carrier density in the central region of the conventional diode apparently rises since the carriers are injected from the n-type impurity layer 6 and the p-type impurity layer 7 which sandwich the intermediate metal layer 8 therebetween. That is, the total number of the accumulated carriers in the n⁻-type semiconductor layer is larger than that in the conventional diode, so that the ON-state voltage can be lower than that in the conventional diode.

In the conventional diode, heat is emitted from two places of the anode electrode and cathode electrode, whereas in the diode in this embodiment, heat is also emitted from the metal layer in addition to the anode electrode and cathode electrode. Therefore, the influence of heat on electric characteristics is suppressed.

(Second Embodiment)

Figure 4:
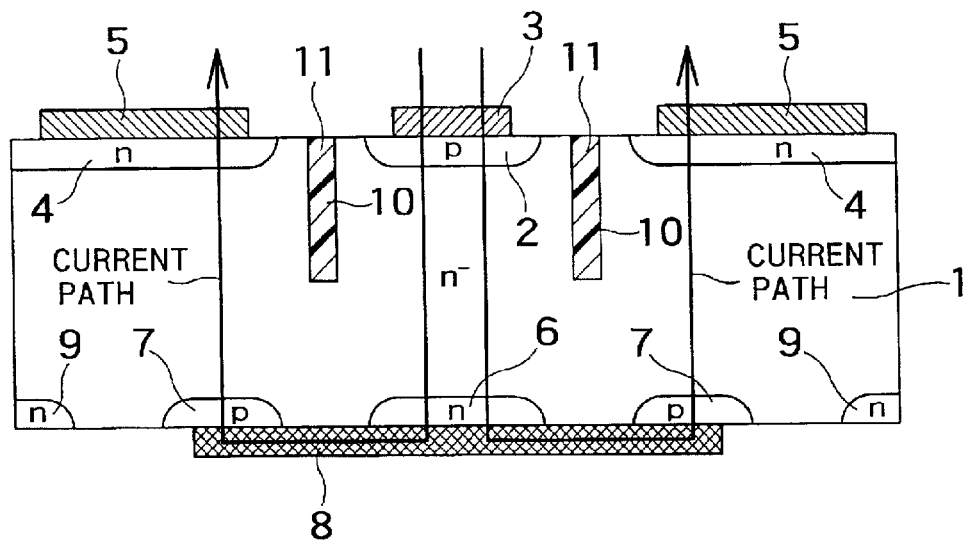
FIG. 4 is a sectional view schematically showing the second embodiment of a diode according to the present invention.

FIG. 4 is a sectional view schematically showing the second embodiment of a high-withstand-voltage, high-speed diode according to the present invention. Furthermore, the same reference numbers are given to portions having the same function or construction as that in the above described first embodiment, and the detailed descriptions thereof are omitted.

The difference between this embodiment and the above described first embodiment is that, in the first embodiment, the anode layer 2 is sufficiently spaced from the cathode layer 4 so that the diode comprising both layers does not operate, whereas in this embodiment, an electrical insulating region for electrically separating an anode layer from a cathode layer is provided between the anode layer and the cathode layer.

That is, as shown in FIG. 4, in this embodiment, a p-type anode layer 2 is selectively diffused and formed in the central portion on a first principal plane of an n⁻-type semiconductor layer 1, and an n-type cathode layer 4 is selectively diffused and formed apart from the p-type anode layer 2 so as to surround the p-type anode layer 2.

A trench groove 10 having a predetermined depth is formed from the surface of the n⁻-type semiconductor layer 1 between the n-type cathode layer 4 and the p-type anode layer 2. The trench groove 10 is filled with an insulating material 11, such as an oxide film. For example, the trench groove 10 has an annular structure in plane so as to completely surround the p-type anode layer 2 in order to electrically separate the p-type anode layer 2 from the cathode layer 4. The trench groove 10 has a sufficient depth from the surface of the n⁻-type semiconductor layer 1 so that a parasitic diode comprising the p-type anode layer 2 and the n-type cathode layer 4 does not operate. It is not always required to provide the insulating material 11.

Similar to the first embodiment, an anode electrode 3 is provided so as to ohmic-contact the surface of the p-type anode layer 2, and a cathode electrode 5 is provided so as to ohmic-contact the surface of the n-type cathode layer 4. On a second principal plane of the n⁻-type semiconductor layer 1, an n-type impurity layer 6, a p-type impurity layer 7 and an n-type stopper layer 9 are selectively formed. A metal layer 8 is provide so as to straddle the n-type impurity layer 6 and the p-type impurity layer 7 and so as to ohmic-contact both layers.

In addition to the same effects as those in the above described first embodiment, since the trench groove 10 prevents the parasitic diode comprising the n-type cathode layer 4 from operating, the anode layer 2 and the cathode layer 4 may be spaced from each other so as to allow to form the trench groove 10, so that the diode with the above described construction can be smaller than the diode in the above described first embodiment.

(Third Embodiment)

Figure 5:
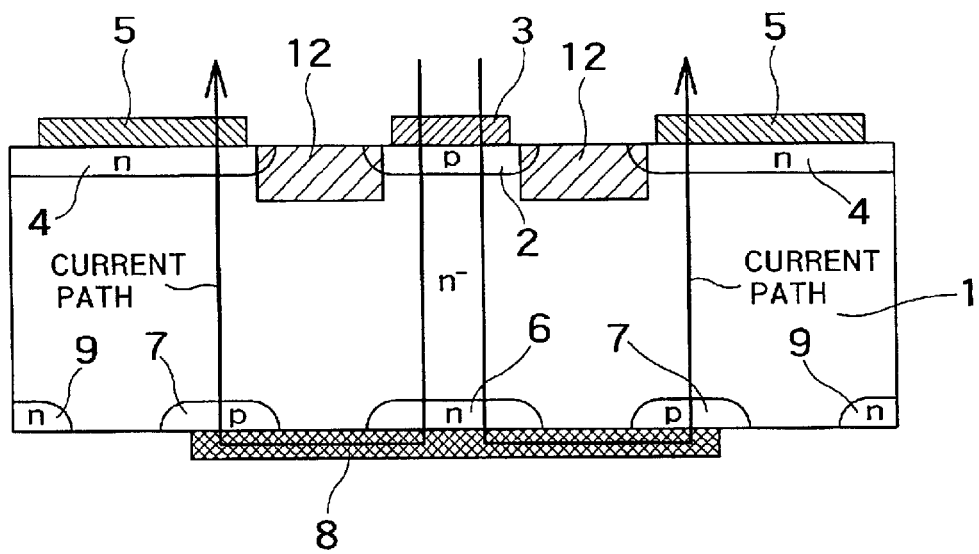
FIG. 5 is a sectional view schematically showing the third embodiment of a diode according to the present invention.

FIG. 5 is a sectional view schematically showing the third embodiment of a high-withstand-voltage, high-speed diode according to the present invention. Furthermore, the same reference numbers are given to portions having the same function or construction as that in the above described first embodiment, and the detailed descriptions thereof are omitted.

The difference between this embodiment and the above described first embodiment is that, in the first embodiment, the anode layer 2 is sufficiently spaced from the cathode layer 4 so that the diode comprising both layers does not operate, whereas in this embodiment, a low lifetime region is provided between the anode layer and the cathode layer.

That is, as shown in FIG. 5, in this embodiment, a p-type anode layer 2 is selectively diffused and formed in the central portion on a first principal plane of an n⁻-type semiconductor layer 1, and an n-type cathode layer 4 is selectively diffused and formed apart from the p-type anode layer 2 so as to surround the p-type anode layer 2.

A life time region 12 having a predetermined depth is formed from the surface of the n⁻-type semiconductor layer 1 between the n-type cathode layer 4 and the p-type anode layer 2. The low life time region 12 is a resistance increasing region so that a parasitic diode comprising the p-type anode layer 2 and the cathode layer 4 does not operate. For example, this region has an annular structure in plane so as to completely surround the p-type anode layer 2, and has a sufficient depth from the surface of the n⁻-type semiconductor layer 1. In order to form the low life time region 12, electron beam irradiation, proton irradiation or helium irradiation may be carried out.

Similar to the first embodiment, an anode electrode 3 is provided on the surface of the p-type anode layer 2 so as to ohmic-contact the surface thereof, and a cathode electrode 5 is provided on the surface of the n-type cathode layer 4 so as to ohmic-contact the surface thereof. On a second principal plane of the n⁻-type semiconductor layer 1, an n-type impurity layer 6, a p-type impurity layer 7 and an n-type stopper layer 9 are selectively formed. A metal layer 8 is provide so as to straddle the n-type impurity layer 6 and the p-type impurity layer 7 and so as to ohmic-contact both layers.

The diode with this construction can be miniaturized similar to the above described second embodiment, in addition to the same effects as those in the above described first embodiment.

(Modified Example of Third Embodiment)

Figure 6:
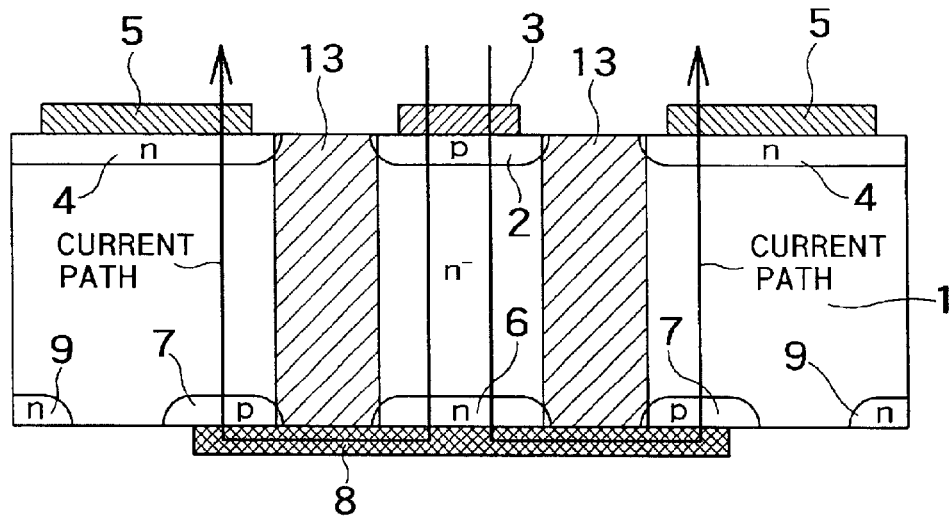
FIG. 6 is a sectional view schematically showing a modified example of the third embodiment of a diode according to the present invention.
Figure 7:
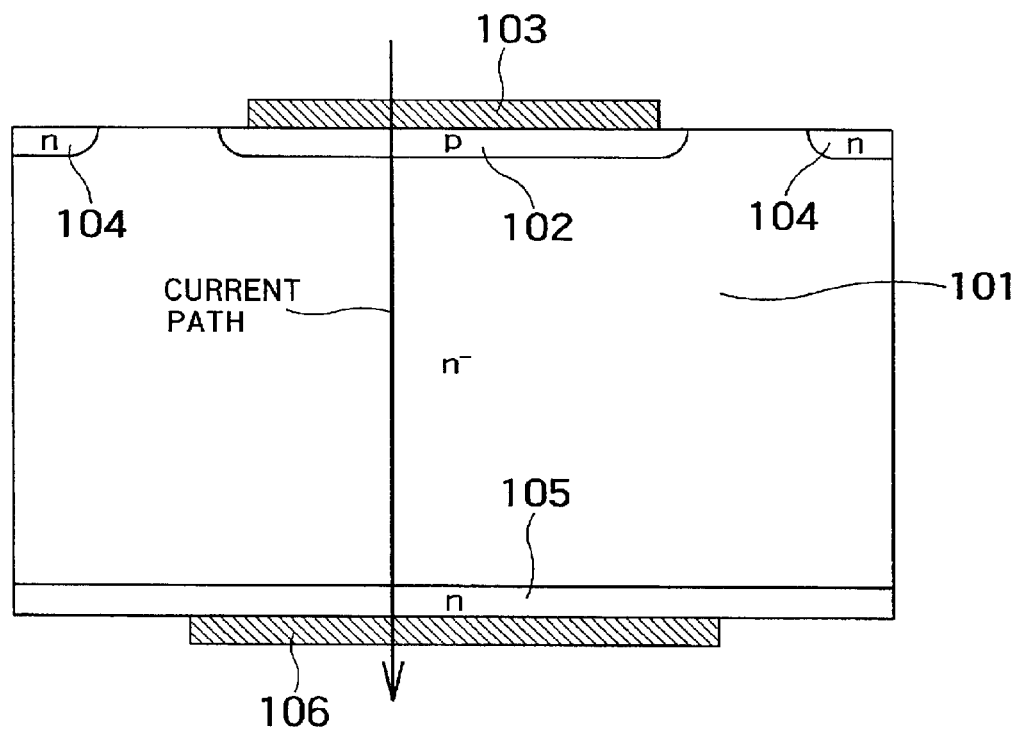
FIG. 7 is a sectional view schematically showing a conventional diode.

FIG. 6 is a sectional view schematically showing a modified example of the third embodiment of a high-withstand-voltage, high-speed diode according to the present invention. Furthermore, the same reference numbers are given to portions having the same function or construction as that in the above described third embodiment, and the detailed descriptions thereof are omitted.

The difference between this embodiment and the above described third embodiment is that, in the third embodiment, the low life time region 12 is formed in the $n^-$-type semiconductor layer 1 from the first principal plane of the $n^-$-type semiconductor layer so as to have a desired depth, whereas in this example, a low lifetime region 13 is provided so as to pass through the $n^-$-type semiconductor layer 1 from the first principal plane of the $n^-$-type semiconductor layer 1 to the second principal plane thereof. Other constructions are the same as those in the above described third embodiment.

With this construction, the same effects as those in the above described third embodiment can be obtained.

As described above in detail, according to each of the embodiments of the present invention, it is possible to obtain a diode which allows the thickness of the substrate to be smaller than theoretical limit, which can increase the total number of accumulated carriers and which has small switching loss at a high speed.

The present invention should not be limited to the above described embodiments, but the invention can of course be embodied in various ways without departing from the principle of the invention.

For example, while the anode layer 2 and the n-type impurity layer 6 have had the flat circular structure and the cathode layer 4 and the p-type impurity layer 7 have had the flat annular structure in each of the above described embodiments, all of the anode layer, n-type impurity layer, cathode layer and p-type impurity layer may have a flat rectangular structure.

While the semiconductor substrate has been used as the $n^-$-type semiconductor layer 1 in each of the above described embodiment, the present invention should not be limited thereto, but another semiconductor substrate or a semiconductor layer, which is formed on an insulating substrate by the epitaxial growth or the like, may be used.

What is claimed is:

1. A diode comprising:
   a semiconductor layer of a first conductive type having a first principal plane and a second principal plane facing the first principal plane;
   a first impurity layer of a second conductive type which is opposite to said first conductive type, said first impurity layer being selectively formed on said first principal plane of said semiconductor layer;
   a second impurity layer of the first conductive type which is selectively formed on said first principal plane of said semiconductor layer apart from said first impurity layer;
   a first main electrode connected to said first impurity layer;
   a second main electrode connected to said second impurity layer;
   a third impurity layer of the first conductive type which is selectively formed on said second principal plane of said semiconductor layer and which is formed so as to face said first impurity layer; and
   a fourth impurity layer of the second conductive type which is selectively formed on said second principal plane of said semiconductor layer and which is formed so as to face said second impurity layer; and
   short-circuit part to electrically connect said third impurity layer to said fourth impurity layer,
   wherein said second impurity layer has an annular structure so as to surround said first impurity layer, and said fourth impurity layer has an annular structure so as to surround said third impurity layer.

2. A diode as set forth in claim 1, wherein said first impurity layer is spaced from said second impurity layer by a distance which is greater than such a distance that a parasitic diode comprising said first and second impurity layers does not operate.

3. A diode as set forth in claim 1, wherein said short-circuit part comprises a metal layer which is formed so as to straddle the surface of said third and fourth impurity layers.

4. A diode comprising:
   a semiconductor layer of a first conductive type having a first principal plane and a second principal plane facing the first principal plane;
   a first semiconductor layer of a second conductive type which is selectively formed on said first principal plane of said semiconductor layer;
   a second impurity layer of the first conductive type which is selectively formed on said first principal plane of said semiconductor layer apart from said first impurity layer;
   an electrical insulating region which is formed in said first semiconductor layer from said first principal plane of said semiconductor layer between said first and second impurity layers;
   a first main electrode connected to said first impurity layer;
   a second main electrode connected to said second impurity layer;
   a third impurity layer of the first conductive type which is selectively formed on said second principal plane of said semiconductor layer and which is formed so as to fare said first impurity layer;
   a fourth impurity layer of the second conductive type which is selectively formed on said second principal plane of said semiconductor layer and which is formed so as to face said second impurity layer; and
   short-circuit part to electrically connect said third impurity layer to said fourth impurity layer,
   wherein said second impurity layer has an annular structure so as to surround said first impurity layer, and said fourth impurity layer has an annular structure so as to surround said third impurity layer.

5. A diode as set forth in claim 4, wherein said electrical insulating region comprises a trench groove.

6. A diode as set forth in claim 5, wherein an insulating material is filled in said trench groove.

7. A diode as set forth in claim 4, wherein said short-circuit part comprises a metal layer which is formed so as to straddle the surface of said third and fourth impurity layers.

* * * * *